(12) United States Patent
Ballantyne

(10) Patent No.: US 8,054,116 B2
(45) Date of Patent: Nov. 8, 2011

(54) THRESHOLD DITHERING FOR TIME-TO-DIGITAL CONVERTERS

(75) Inventor: Gary John Ballantyne, Christchurch (NZ)

(73) Assignee: QUALCOMM Incorporated, San Diego, CA (US)

( * ) Notice: Subject to any disclaimer, the term of this patent is extended or adjusted under 35 U.S.C. 154(b) by 225 days.

(21) Appl. No.: 12/018,343

(22) Filed: Jan. 23, 2008

(65) Prior Publication Data

US 2009/0273377 A1    Nov. 5, 2009

(51) Int. Cl.
*H03L 7/06*    (2006.01)
(52) U.S. Cl. ............... 327/158; 327/156; 327/157
(58) Field of Classification Search ............ 327/156, 327/158
See application file for complete search history.

(56) References Cited

U.S. PATENT DOCUMENTS

| 6,429,693 | B1* | 8/2002 | Staszewski et al. ........ 327/12 |
| 2005/0184901 | A1* | 8/2005 | DaDalt ................. 341/157 |
| 2005/0186920 | A1 | 8/2005 | Staszewski et al. |

OTHER PUBLICATIONS

International Search Report and Written Opinion~PCT/US2009-031595, International Searching Authority~European Patent Office, Apr. 28, 2009.
Rahkonen T et al: "Time interval measurements using integrated tapped CMOS delay lines" 19890814; 198908140-019890816, Aug. 14, 1989, pp. 201-205, XP010090157.
Wenbo Liu et al: "A Test Strategy for Time-to-Digital Converters Using Dynamic Element Matching and Dithering" Circuits and Systems, 2005. ISCAS 2005. IEEE International Symposium on Kobe Japan May 23-26, 2005, Piscataway, NJ, USA, IEEE, May 23, 2005, pp. 3809-3812, XP010816495, Section B. Time Internval Generation with Dithering, p. 3811, col. 1

* cited by examiner

*Primary Examiner* — Lincoln Donovan
*Assistant Examiner* — John W Poos
(74) *Attorney, Agent, or Firm* — Larry J. Moskowitz

(57) ABSTRACT

Techniques for dithering quantization thresholds of time-to-digital converters (TDC's) in all-digital phase-locked loops (ADPLL's) are disclosed. In an embodiment, the delay introduced by an individual buffer in a TDC delay line may be dithered. In another embodiment, the delay associated with the TDC delay line may be extended by a fixed amount to accommodate dithering of the zero-delay threshold.

29 Claims, 11 Drawing Sheets

THRESHOLD DITHERING FOR TIME-TO-DIGITAL CONVERTERS

TECHNICAL FIELD

The disclosure relates to the design of time-to-digital converters (TDC's), and more specifically, to the application of TDC's to all-digital phase-locked loops (ADPLL's).

BACKGROUND

Time-to-digital converters are designed to generate a digital representation of a time interval elapsing between two events. TDC's discretize time intervals, just as analog-to-digital converters (ADC's) discretize analog signal amplitudes. The difference between an actual time interval and the discretized version of that time interval is known as the quantization error, and is determined by the TDC resolution.

Recently, TDC's have found application in the design of all-digital phase-locked loops (ADPLL's), wherein a TDC is used to measure the time difference between an event in a digitally generated output signal and a corresponding event in a reference signal. In an ADPLL, TDC quantization error may accumulate over time, leading to spurs and other undesirable phenomena in the ADPLL output. It would be desirable to reduce the occurrence of such phenomena arising from TDC quantization error.

SUMMARY

An aspect of the present disclosure provides a method for reducing spurs in an all-digital phase-locked loop (ADPLL), the ADPLL generating an output signal DCLK based on a reference signal FCLK, the ADPLL comprising a time-to-digital converter (TDC) for measuring a time interval elapsing between an event in FCLK and a corresponding event in DCLK, the method comprising dithering a quantization threshold of the TDC.

Another aspect of the present disclosure provides a time-to-digital converter (TDC) for a digital phase-locked loop (PLL), the TDC quantizing a time interval elapsing between an event in a signal FCLK and a corresponding event in a signal DCLK and outputting a digital TDC output signal, wherein a quantization threshold of the TDC is dithered.

Yet another aspect of the present disclosure provides A time-to-digital converter (TDC) for a digital phase-locked loop (PLL), the PLL generating an output signal DCLK based on a reference signal FCLK, the TDC comprising means for dithering a quantization threshold of the TDC; and means for measuring a time interval elapsing between an event in FCLK and a corresponding event in DCLK.

Yet another aspect of the present disclosure provides a time-to-digital converter (TDC) for a digital phase-locked loop (PLL), the PLL generating an output signal DCLK based on a reference signal FCLK, the TDC comprising means for dithering a quantization threshold of the TDC; and means for measuring a time interval elapsing between an event in FCLK and a corresponding event in DCLK.

DETAILED DESCRIPTION

The present disclosure describes dithering the quantization thresholds of the TDC to reduce spurs and other undesirable behavior in an ADPLL.

Figure 1:
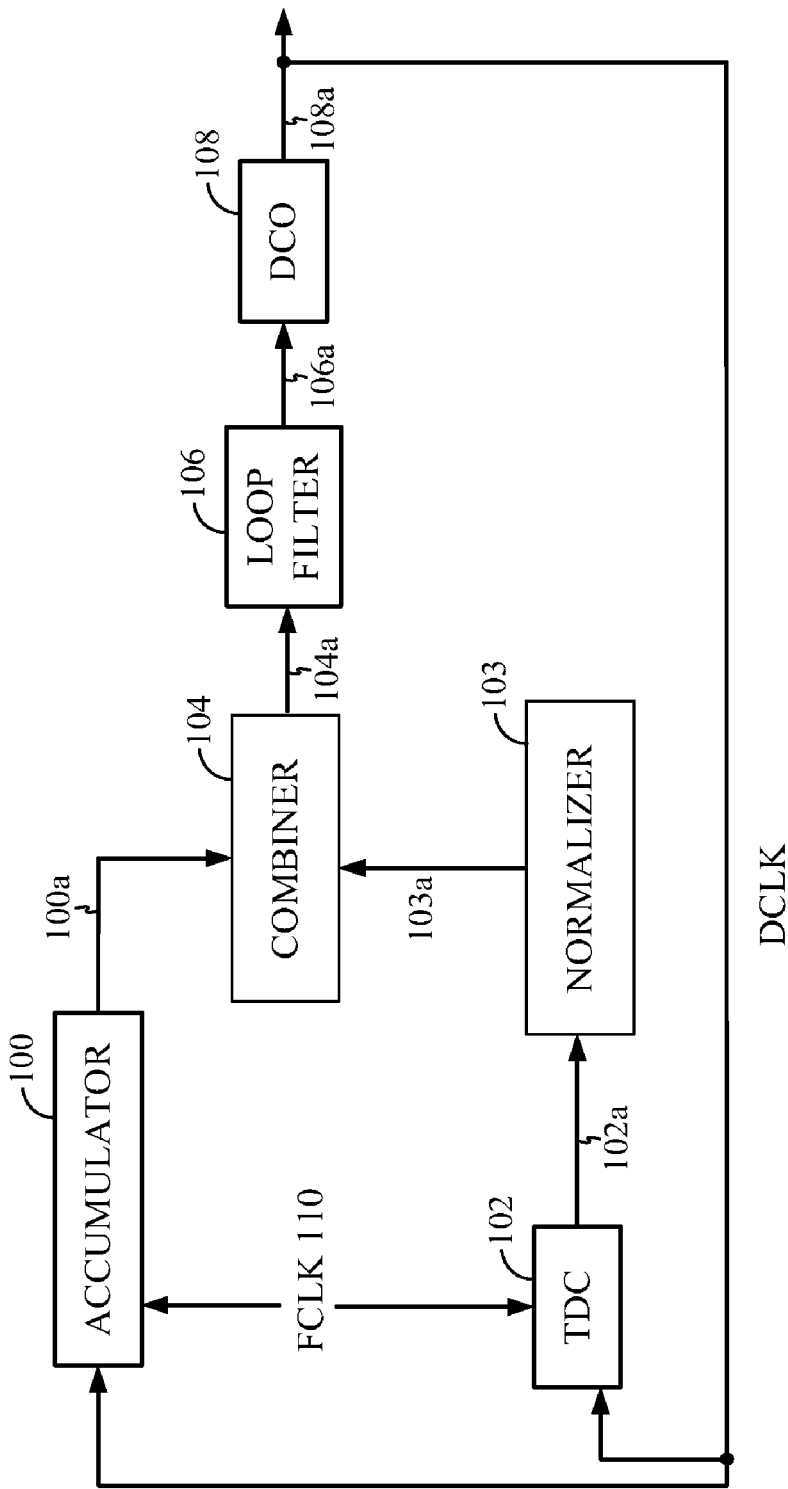
FIG. 1 depicts a baseline implementation of a prior art ADPLL.

FIG. 1 depicts a baseline implementation of a prior art ADPLL. The ADPLL includes an accumulator 100, time-to-digital converter (TDC) 102, normalizer 103, combiner 104, loop filter 106, and digitally controlled oscillator (DCO) 108. The DCO 108 outputs a signal DCLK, or 108a. The frequency of DCLK depends on the digital input 106a to the DCO 108. A reference signal FCLK or 110, is provided to both the accumulator 100 and the TDC 102.

During operation of the ADPLL, the frequency of FCLK is typically lower than the frequency of DCLK. The accumulator 100 and TDC 102 collectively count the number of DCLK cycles elapsing in one FCLK cycle. The accumulator 100 may compute the integer portion of the elapsed number of cycles, while the TDC 102 may compute the fractional portion.

In an ADPLL, the TDC may compute the fractional portion by discretizing the time interval elapsing between a rising edge of DCLK and the subsequent rising edge of FCLK. Alternatively, a TDC may discretize a time interval elapsing between a falling edge of DCLK and the subsequent rising edge of FCLK, or any other combination of rising and falling edges. One of ordinary skill in the art will realize that the techniques disclosed herein may readily be applied to such alternative embodiments. The discretized time interval is normalized to units of DCLK cycles in normalizer 103, and is subsequently combined with the output of accumulator 100 using combiner 104.

Figure 1A:
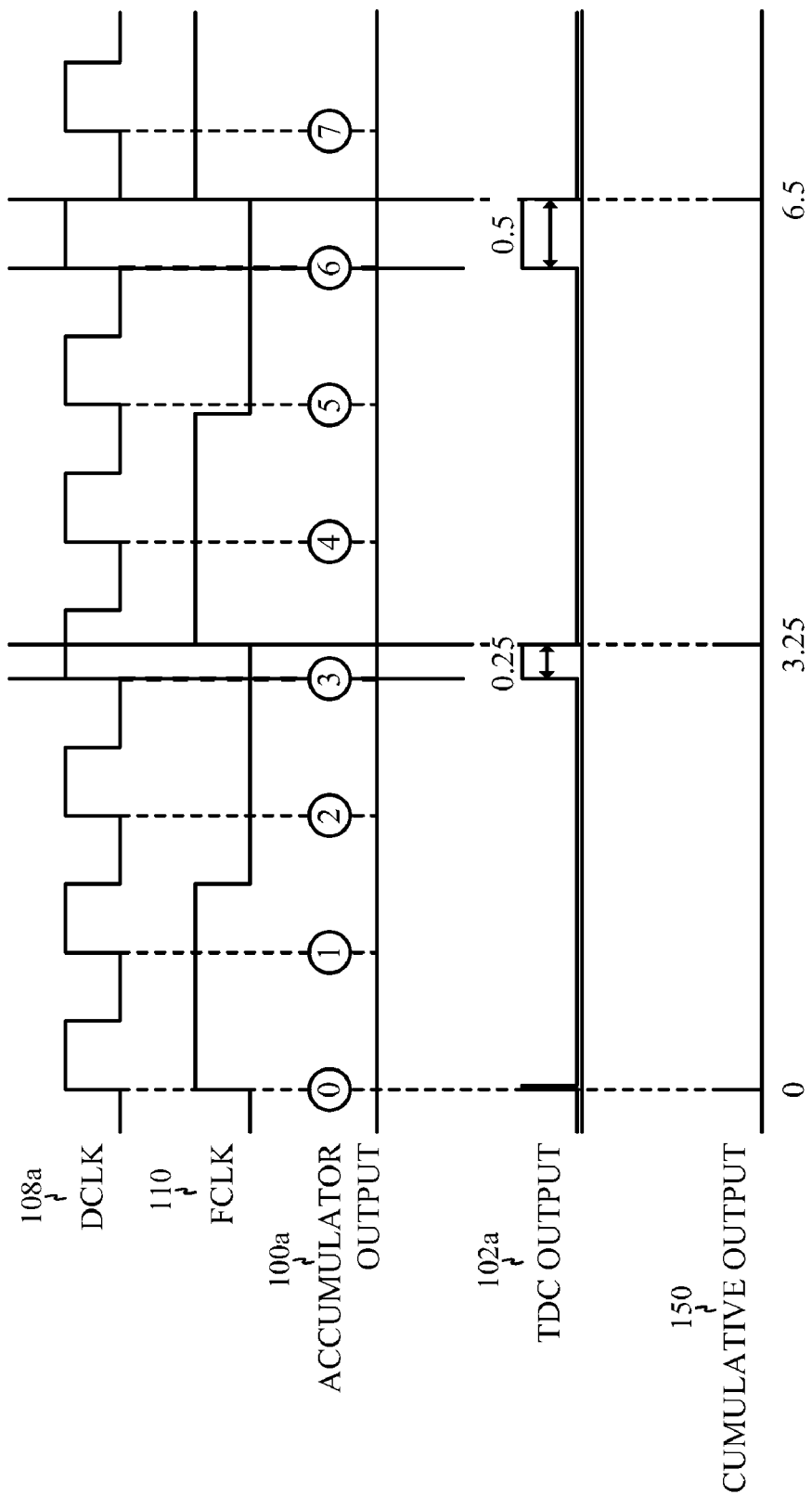
FIG. 1A illustrates an example of signal values present in the ADPLL of FIG. 1.

FIG. 1A illustrates an example of signal values present in the ADPLL of FIG. 1. In FIG. 1A, the accumulator output 100a is initialized to 0 at a starting time. The accumulator output 100a counts a total number of DCLK cycles elapsed from the starting time. Meanwhile, the TDC output 102a indicates the value of a time interval elapsed between a rising edge of FCLK and the previous rising edge of DCLK. For example, after the accumulator output measures 3 DCLK cycles, the subsequent TDC output measures 0.25 DCLK cycles to the next rising edge of FCLK. The signal marked Cumulative Output 150 combines the accumulator output 100a and the TDC output 102a to keep track of the total number of DCLK cycles elapsed relative to cumulative cycles of FCLK. In an embodiment, to convert the time interval measured by the TDC into a fractional value to be added to a whole number of DCLK cycles, the TDC measurement may be divided by an estimate of the average DCLK period in normalizer 103.

By taking the difference between readings of Cumulative Output 150 on successive rising edges of FCLK, the number of DCLK cycles elapsed per cycle of FCLK can be determined.

Figure 2:
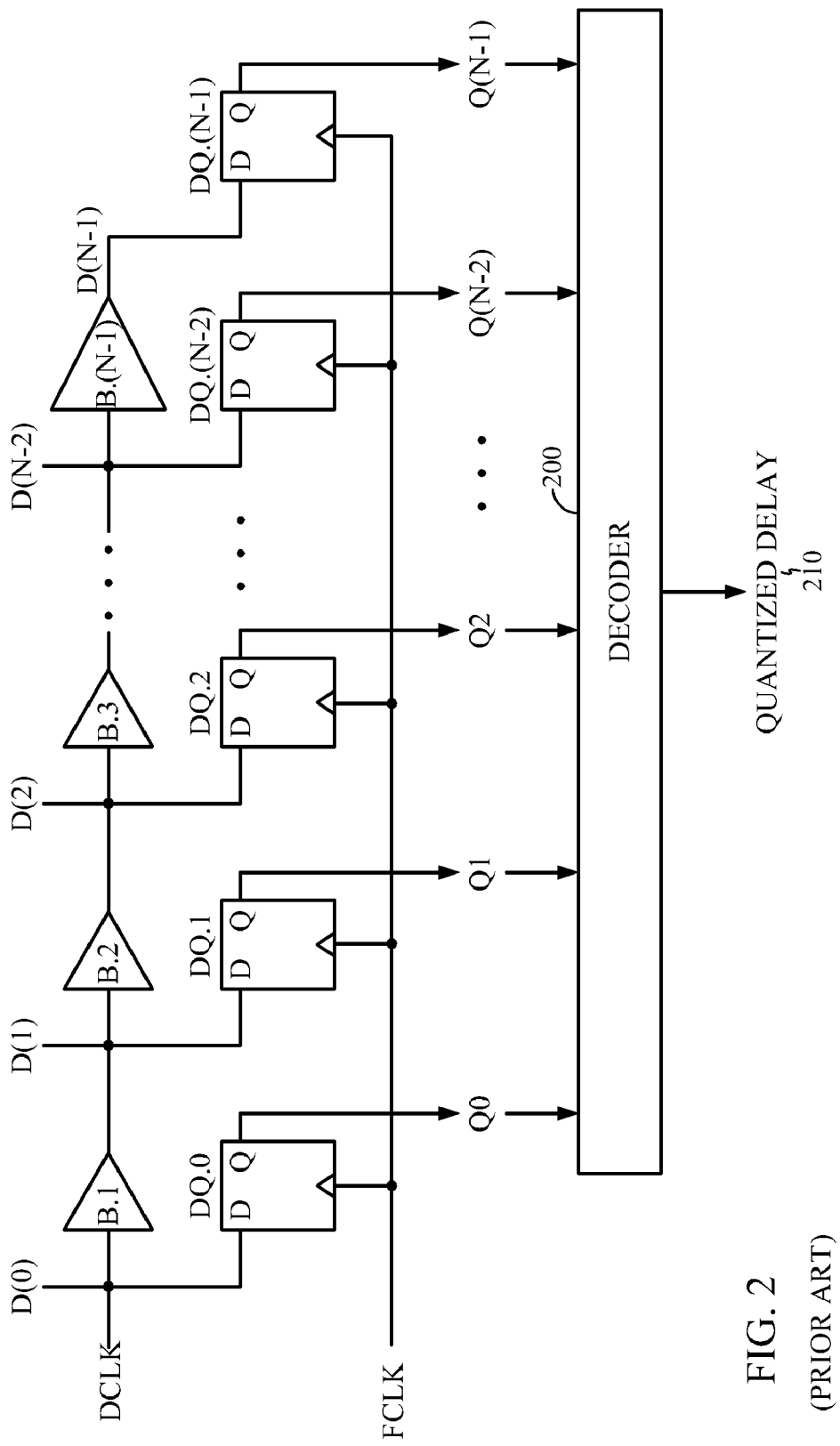
FIG. 2 depicts an implementation of a prior art TDC for the ADPLL shown in FIG. 1.

FIG. 2 depicts an implementation of a prior art TDC for the ADPLL shown in FIG. 1. In FIG. 2, non-inverting buffers B.1 through B.(N−1), each having a delay $T_D$, generate progressively delayed versions D(1) through D(N−1) of the original DCLK, or D(0). In an embodiment, N may be chosen to be at least the maximum number of buffer delays associated with a cycle of DCLK. This may be determined during the design of the TDC, and may take into account, e.g., the expected operating frequencies of DCLK, the expected modulation index, and/or the variation in unit TDC delay over process, supply voltages, and temperature. The signals D(0) through D(N−1) are provided to the D inputs of D-Q flip-flops DQ.0 through DQ.(N−1), respectively. Each D-Q flip-flop latches the value at its D input to its Q output on the rising edge of the signal provided to its CLK input, denoted by a triangle in each flip-flop of FIG. 2. In FIG. 2, the CLK input to the D-Q flip-flops is provided with FCLK. The Q outputs of the D-Q flip-flops are provided to a decoder 200, which outputs a digital representation of the quantized delay 210, as later described herein with reference to FIG. 3.

One of ordinary skill in the art will realize that in alternative embodiments, non-inverting buffers B.1 through B.(N−1) may be configured to generate progressively delayed versions of FCLK rather than DCLK. Similarly, DCLK rather than FCLK may be used to clock the D-Q flip-flops. In alternative embodiments, inverting rather than non-inverting buffers may be employed, with appropriate changes made to the decoder. One of ordinary skill in the art may readily apply the techniques of the present disclosure to such embodiments, and such embodiments are contemplated to be within the scope of present disclosure.

Figure 3:
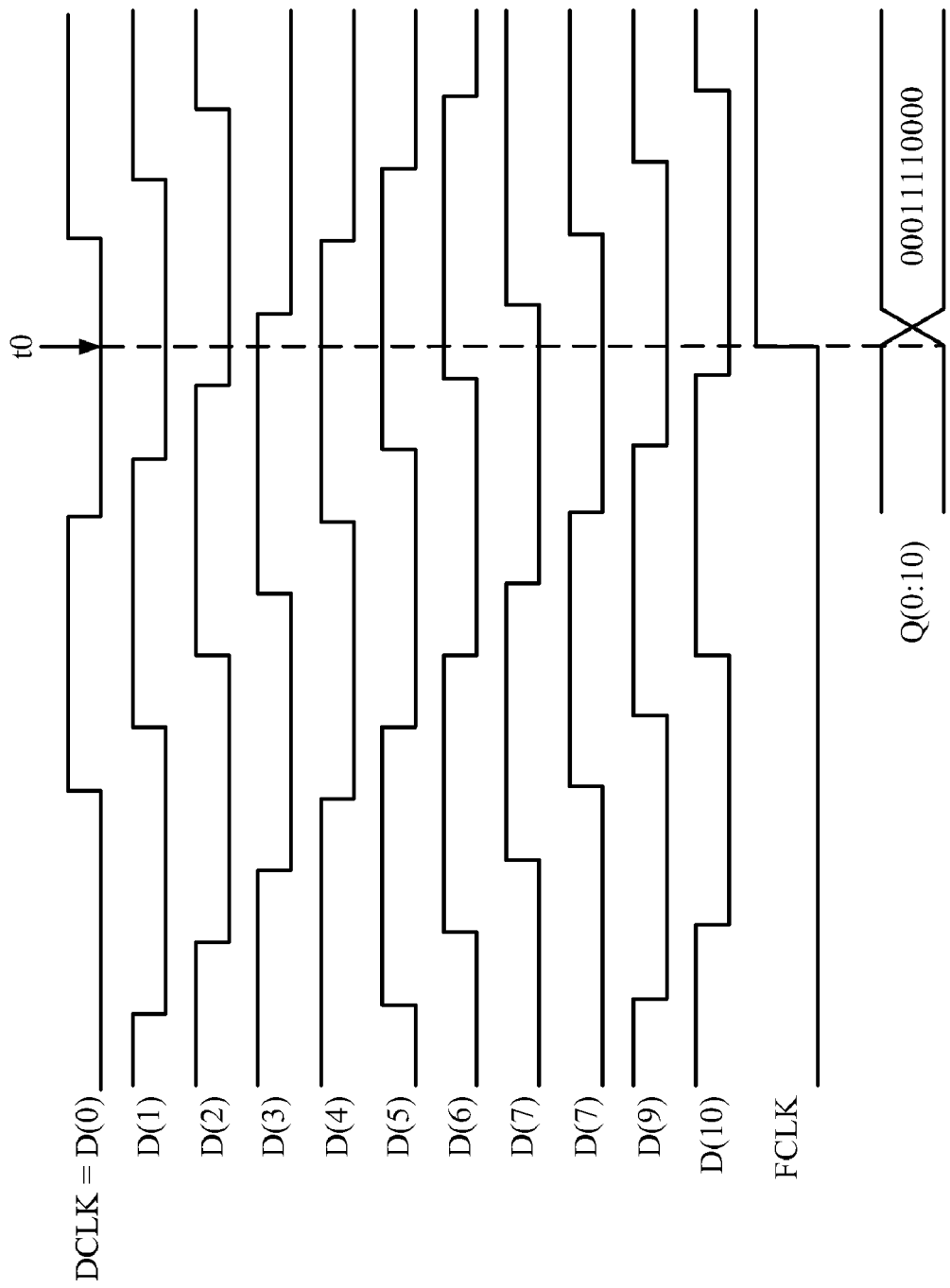
FIG. 3 illustrates an example of the signal values present during operation of the TDC, wherein N is assumed to be 11 for purposes of illustration.

FIG. 3 illustrates an example of the signal values present during operation of the TDC, wherein N is assumed to be 11 for purposes of illustration. In FIG. 3, the first waveform D(0) corresponds to the undelayed version of DCLK, while subsequent waveforms D(1) through D(10) correspond to the progressively delayed versions of DCLK shown in the embodiment of FIG. 2. At time t0, the rising edge of FCLK latches the values of D(0) through D(10) into the respective D-Q flip-flops DQ.0 through DQ.10. In the example shown, the resultant composite output of the D-Q flip-flops, Q(0:10), has a value of [00011110000]. From the composite output, the relative timing of the rising edge of DCLK versus the rising edge of FCLK can be determined. For example, in FIG. 3, the transition from Q(6)=1 to Q(7)=0 in Q(0:10) indicates that the rising edge of FCLK trails the rising edge of DCLK by between 6 $T_D$ and 7 $T_D$, where $T_D$ is the delay of a single buffer.

One of ordinary skill in the art will realize the relative timing of the rising edge of FCLK versus other preceding events in DCLK may be computed by providing for more buffers in the delay line. For example, the time interval elapsing between the rising edge of FCLK and a second preceding rising edge of DCLK may be computed by adding more buffers, as described further herein with reference to FIGS. 6A-6C. Such alternative embodiments are contemplated to be within the scope of the present disclosure.

Figure 4:
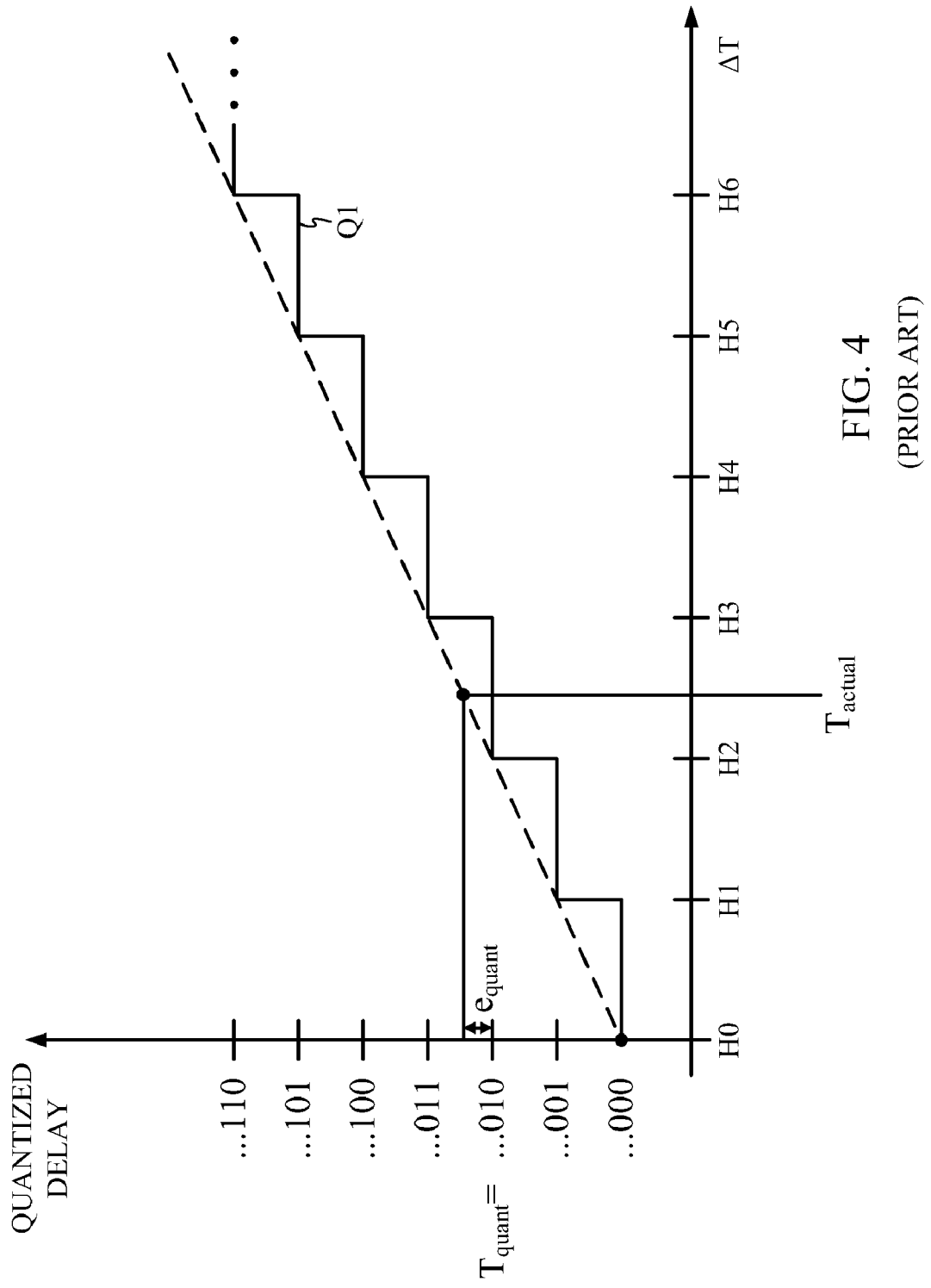
FIG. 4 depicts a transfer characteristic Q1 of a typical TDC.

FIG. 4 depicts a transfer characteristic Q1 of a typical TDC. In FIG. 4, the horizontal axis indicates an actual time interval between the rising edge of FCLK and the first (immediately) preceding rising edge of DCLK. The markings H1, H2, etc., on the horizontal axis correspond to the (fixed) quantization thresholds of the TDC. For the embodiment of FIG. 2, the quantization thresholds are determined by the (ideally uniform) delay $T_D$ introduced by each of buffers B.1 through B.(N−1). The vertical axis indicates the quantized delay output by the TDC. In an embodiment, the quantized delay corresponds to the quantized delay 210 output by decoder 200 in FIG. 2.

As shown in FIG. 4, for an arbitrary time interval $T_{actual}$, there will exist a quantization error $e_{quant}$ due to the difference between $T_{actual}$ and the discretized version $T_{quant}$ of $T_{actual}$. If the quantization error accumulates over multiple samples of the TDC output, then the ADPLL loop will eventually cause DCLK to be readjusted to compensate for the accumulated quantization error. Such readjustment may result in unwanted spurs in the ADPLL output.

The present disclosure provides for techniques to reduce such unwanted spurs. In an aspect, the quantization error in the TDC output may be randomized by dithering the quantization thresholds of the TDC.

Figure 5A:
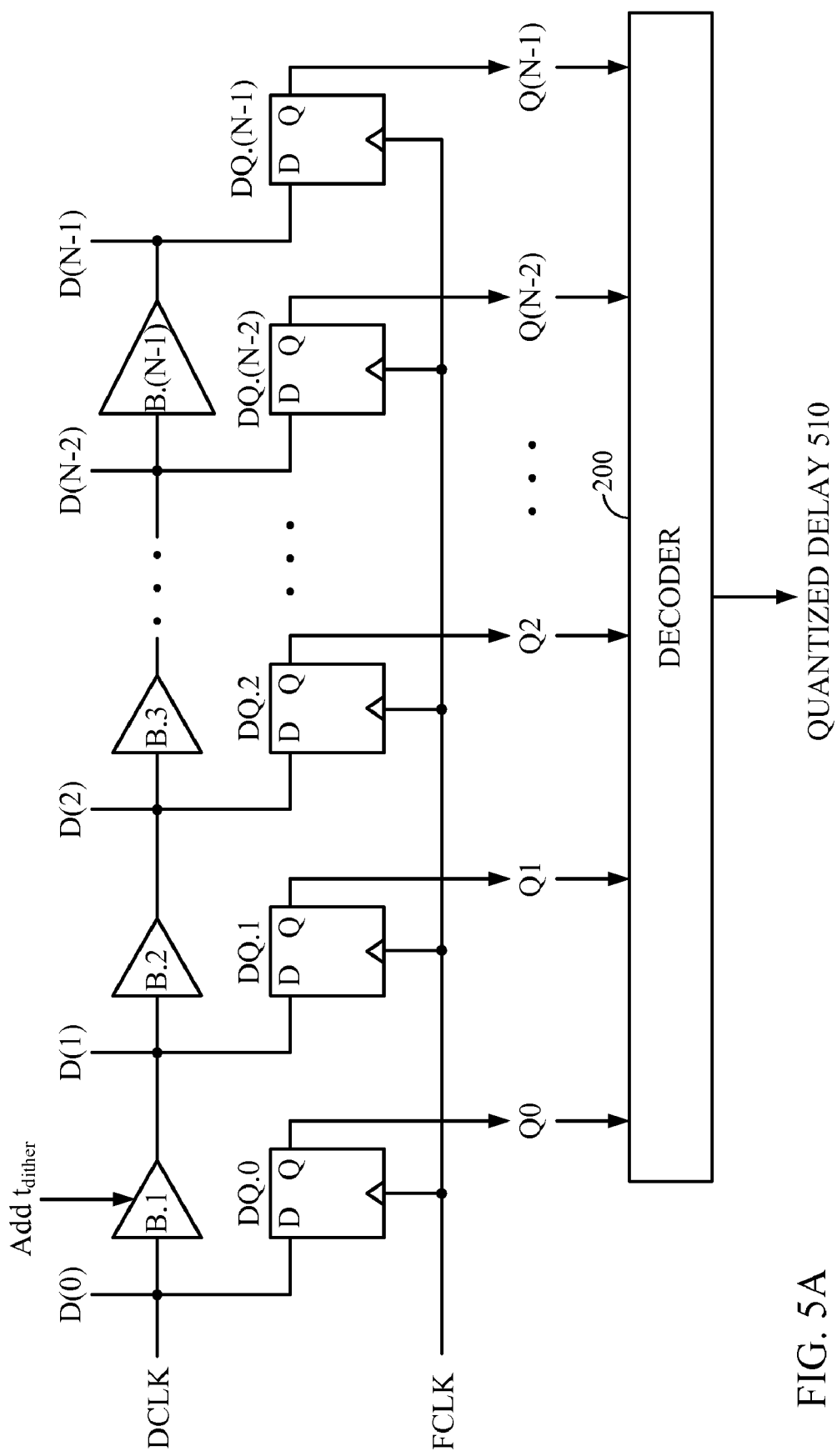
FIG. 5A depicts an embodiment of the present disclosure wherein the delay of the first buffer B.1 is made configurable.
Figure 5B:
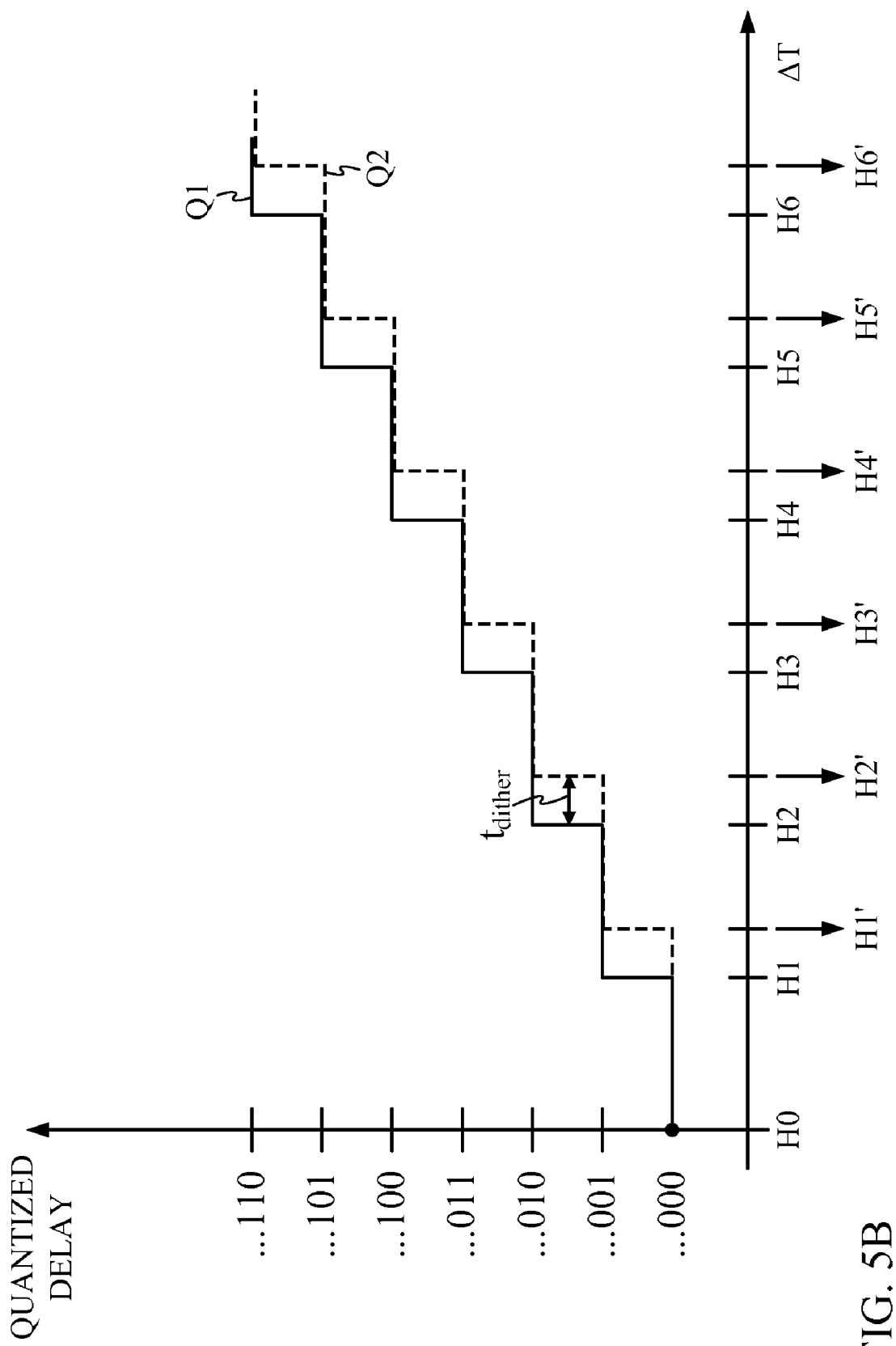
FIG. 5B compares the transfer characteristic Q2 of a TDC according to the embodiment depicted in FIG. 5A with the original TDC transfer characteristic Q1 depicted in FIG. 4.

FIG. 5A depicts an embodiment of the present disclosure wherein the delay of the first buffer B.1 is made configurable. In the embodiment shown, the net delay introduced by the first buffer is equal to $T_D$ plus a configurable variable $t_{dither}$. FIG. 5B compares the transfer characteristic Q2 of a TDC according to the embodiment depicted in FIG. 5A with the original TDC transfer characteristic Q1 depicted in FIG. 4. In FIG. 5B, Q2 is seen to be a horizontally shifted version of Q1, with the amount of the horizontal shift equal to $t_{dither}$. Note the horizontal shift in the transfer characteristic is accompanied by a shift in each of the quantization thresholds H1, H2, etc., by $t_{dither}$, to generate thresholds H1', H2', etc.

In an embodiment, $t_{dither}$ may range from 0 to $T_D$, so that the delay provided by buffer B.1 may range from $T_D$ to 2 $T_D$. In an embodiment, $t_{dither}$ may be "dithered," or varied, over the range $T_D$ to 2 $T_D$, every time the TDC samples a time interval. The dithering spreads the quantization error over a range of values, thus avoiding the accumulation of fixed quantization errors that causes unwanted spurs in the ADPLL output. The dithering may be introduced using any of several techniques known to one of ordinary skill in the art, as further described hereinbelow.

One of ordinary skill in the art will realize that any net quantization error bias in the TDC output resulting from the dithering may be readily accounted for in the overall design of the TDC or ADPLL. For example, if $t_{dither}$ ranges uniformly from 0 to $T_D$, then a net bias of 0.5 $T_D$ may be subtracted from the TDC output either by the TDC or by subsequent stages of the ADPLL. Alternatively, the net bias may be left in the TDC output, and the loop may be relied upon to self-adjust to compensate for the bias.

Note that according to the embodiment depicted in FIG. 5A, the threshold H0 cannot be dithered by adjusting the delay of the first buffer B.1, as the signal D0 precedes any delay introduced by B.1. This may lead to residual fixed quantization error whenever the time interval to be quantized is close to the threshold H0, i.e., whenever the time interval to be quantized by the TDC is less than the delay of the first buffer B.1.

In an aspect of the present disclosure, the cyclical nature of DCLK may be relied upon to dither the threshold H0 along with the other thresholds. This may be done by extending the delay line of the TDC to measure the time interval between FCLK and a second preceding edge of DCLK, dithering the thresholds associated with this time interval, and then accounting for the extra measured cycle of DCLK. This scheme is described further hereinbelow.

Figure 6A:
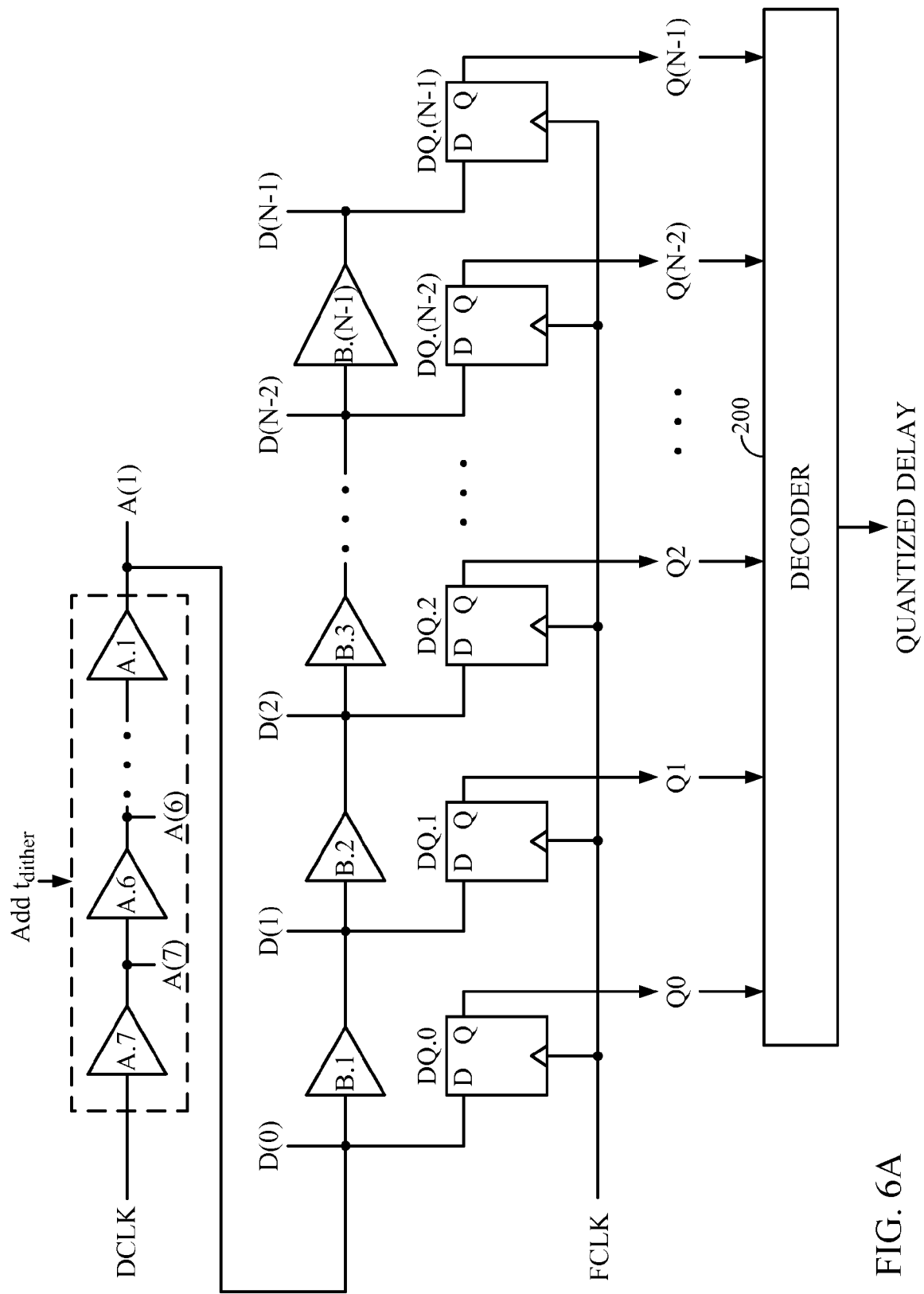
FIG. 6A depicts an embodiment wherein additional delay buffers A.7 through A.1 are provided to the delay line depicted in FIG. 2.

FIG. 6A depicts an embodiment wherein M additional delay buffers are provided to the delay line depicted in FIG. 2. In FIG. 6A, M is 7 for illustration purposes. The additional delay buffers A.7 through A.1 are positioned to precede the buffers B.1 through B.(N−1). In FIG. 6A, delay buffers A.1 through A.7 generate a minimum net nominal delay of 7 $T_D$, plus an additional dithered delay $t_{dither}$ ranging from 0 to $T_D$.

Note that seven buffers A.1 through A.7 are shown in FIG. 6A for illustration purposes only, and that in general an arbitrary number M of additional delay buffers may be chosen depending on the particular embodiment. In an embodiment, M may be chosen to be at least the maximum number of buffer delays associated with a cycle of DCLK. This may be determined during the design of the TDC, and may take into account, e.g., the expected operating frequencies of DCLK, and/or the expected modulation index, and/or other factors considered in choosing the related value N described with reference to FIG. 2. In an embodiment, M may be chosen to be equal to N.

Figure 6B:
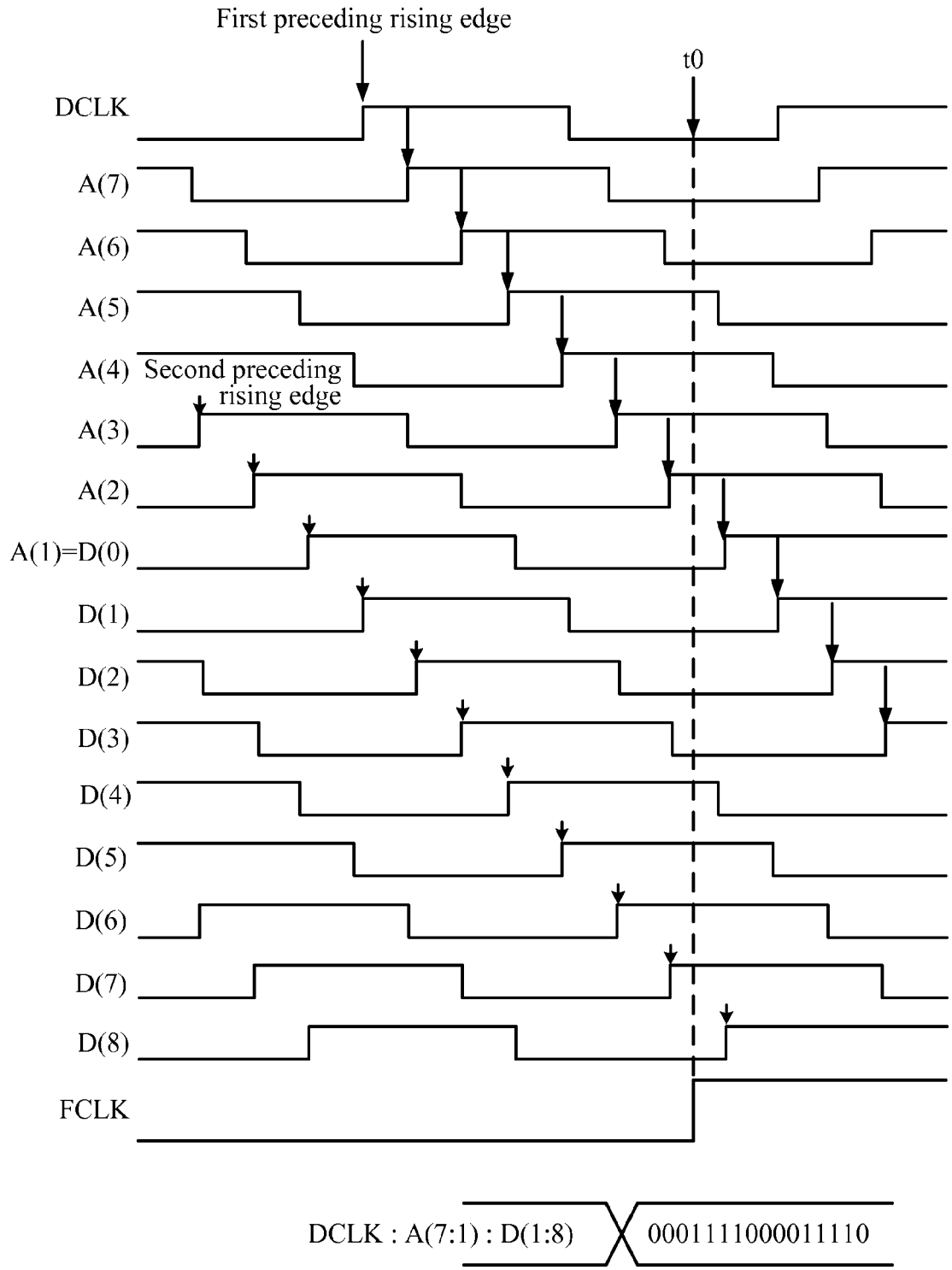
FIG. 6B illustrates the signals present in the embodiment of FIG. 6A, wherein N is equal to 9 for illustration.

FIG. 6B illustrates the signals present in the embodiment of FIG. 6A, wherein N is equal to 9. Note the particular value of N shown is for illustration purposes only, and the scope of the disclosure is not meant to be limited to any particular value of N. FIG. 6B shows an edge labeled "First preceding rising edge," which is the rising edge in DCLK immediately preceding the rising edge of FCLK used to sample the D-Q flip-flops. FIG. 6B also shows an edge labeled "Second preceding rising edge," which is the rising edge in DCLK immediately preceding the First preceding rising edge.

In FIG. 6B, the composite signal DCLK:A(7:1):D(1:8), which has a value of [000111100001110], indicates the output of each stage of the delay line in FIG. 6A. The composite signal contains timing information on both the First preceding rising edge and the Second preceding rising edge of DCLK relative to FCLK. For example, when $t_{dither}$ is set to zero, the transition from A(2)=1 to A(1)=0 in the composite signal indicates that the rising edge of FCLK trails the First preceding rising edge of DCLK by between 6 $T_D$ and 7 $T_D$, as the signals A(2) and A(1) are delayed relative to DCLK by six and seven buffer delays, respectively. Similarly, the transition from D(7)=1 to D(8)=0 indicates that the rising edge of FCLK trails the Second preceding rising edge of DCLK by between 14 $T_D$ and 15 $T_D$.

If a non-zero $t_{dither}$, uniformly distributed over the range [0, $T_D$], is also present in the net delay of buffer elements A1 through A7, then the composite output signal D(1:8) may alternate between two values [00011110] and [00001111], depending on the value of $t_{dither}$.

According to the present disclosure, by dithering the net delay associated with buffers A.7 through A.1, the quantization thresholds, including the threshold corresponding to H0 in FIGS. 4 and 5B, may be dithered, as previously described herein. The time interval between the rising edge of FCLK and the second preceding edge of DCLK is quantized by decoding the outputs of D-Q flip-flops DQ0 through DQ(N−1), as previously described with reference to FIG. 2.

Note in an embodiment, D-Q flip-flops need not be provided for the outputs of buffers A.7 through A.1, if only the information from the second preceding edge of DCLK needs to be captured. Alternatively, D-Q flip-flops may be provided for the outputs of all buffers, including A.7 through A.1.

Figure 6C:
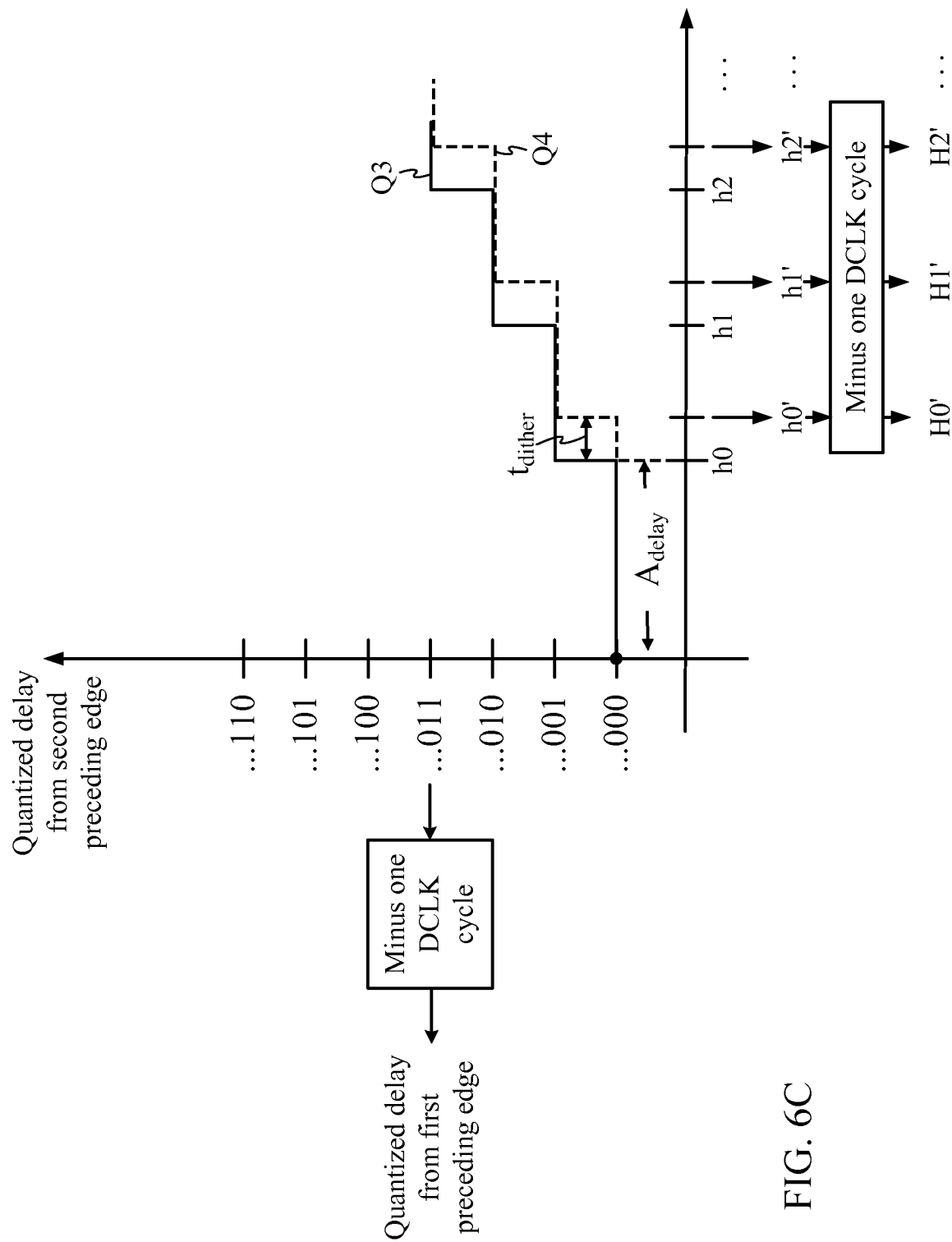
FIG. 6C depicts transfer characteristics Q3, Q4 of a TDC according to the embodiment of FIG. 6A.

FIG. 6C depicts transfer characteristics Q3, Q4 of a TDC according to the embodiment of FIG. 6A. In FIG. 6C, $A_{delay}$ represents the net delay provided by buffers A.7 through A.1 with $t_{dither}$ set to zero. The thresholds h0, h1, etc., represent the thresholds for quantizing the time interval between the second preceding rising edge of DCLK and the rising edge of FCLK. Note the thresholds h0, h1, etc., contrast with the thresholds H0, H1, etc., depicted in FIG. 4, which are for quantizing the time interval between the first preceding rising edge of DCLK and the rising edge of FCLK. To recover the thresholds H0, H1, etc., from the thresholds h0, h1, etc., the number of delays $T_D$ corresponding to one full cycle of DCLK may be subtracted from the output of the TDC.

Note the number of delays $T_D$ corresponding to one full cycle of DCLK may be periodically estimated through calibration mechanisms known to one of ordinary skill in the art. In this case, the average number of delays $T_D$ corresponding to one full cycle of DCLK may be used.

In another embodiment, the number of delays $T_D$ corresponding to one full cycle of DCLK may be estimated each sampling interval from the composite signal DCLK:A(7:1):D(1:8), by counting the number of delays between transitions in the composite signal. For example, in the example shown in FIG. 6B, eight bits separate the first preceding edge from the second preceding edge in the signal [0001111000011110], which corresponds to eight delays for each cycle of DCLK. In this embodiment, D-Q flip-flops may be provided for the outputs of all buffers.

In FIG. 6C, Q3 represents the transfer characteristic of the TDC with $t_{dither}$ set to zero. Q4 represents the transfer characteristic of the TDC with $t_{dither}$ set to a non-zero value. By dithering $A_{delay}$ by an amount $t_{dither}$, the scheme allows for dithering of all quantization thresholds, including H0, in accordance with the principles previously described herein.

The principles disclosed with reference to FIG. 6A may also be applied to measure a time interval between a rising edge of FCLK and any preceding rising edge of DCLK, e.g., the third preceding rising edge, the fourth preceding rising edge, etc. Such embodiments are contemplated to be within the scope of the present disclosure.

One of ordinary skill in the art will realize that there are various ways to implement elements having fixed and variable delays with the functionalities disclosed herein. For example, the variable delay $t_{dither}$ may be applied to any one of the delay buffers A.1 through A.7 in FIG. 6A.

Figure 7:
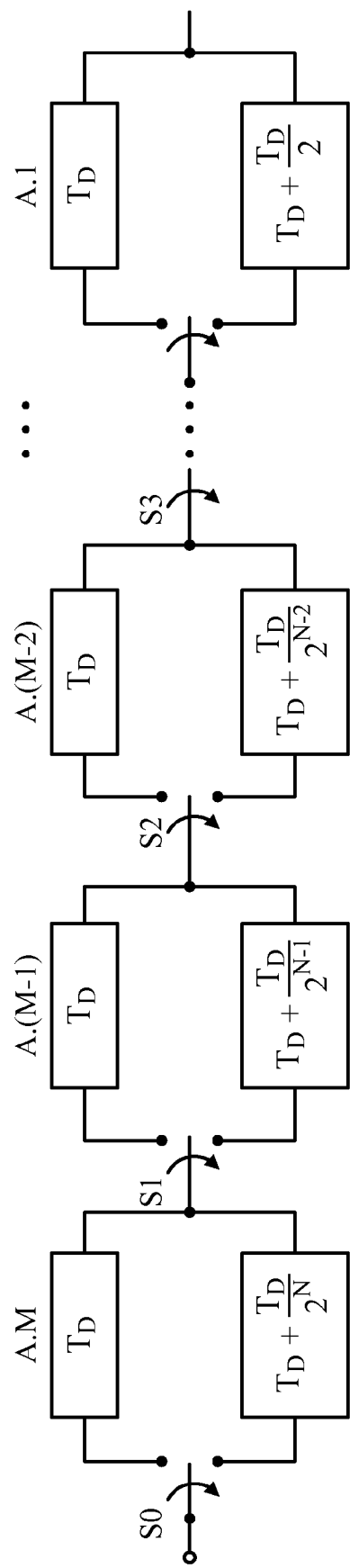
FIG. 7 depicts an alternative embodiment for implementing the variable delay $t_{dither}$ buffers A.1 through A.M, where M is 7 in FIG. 6A, and wherein the net delay of the buffers is configurable by switches S.0, S.1, etc.

FIG. 7 depicts an alternative embodiment for implementing the variable delay $t_{dither}$ in buffers A.1 through A.M, where M is 7 in FIG. 6A, and wherein the net delay of the buffers is configurable by switches S.0, S.1, etc. In FIG. 7, each of the switches may be set up or down to select a corresponding delay element. In the embodiment shown, the fractional delay elements of the bottom path are binary-weighted to allow for flexibility in setting the value of the total delay. For example, setting all switches up would correspond to a total delay of M $T_d$, while setting all switches down would correspond to a total delay of $(M+(2^M-1)/2^M)$ $T_D$. One of ordinary skill in the art will realize that delay values in between the two limits may be achieved by selectively setting some of the switches up and some of the switches down.

One of ordinary skill in the art will realize that alternative arrangements of the switches are possible. Such embodiments are contemplated to be within the scope of the present disclosure.

One of ordinary skill in the art will also realize that while dithering of the TDC quantization thresholds has been described with reference to dithering the delay associated with a delay line in this disclosure, other techniques for dithering a quantization threshold of the TDC may also be utilized. The disclosed techniques for dithering are not meant to restrict the scope of the disclosure to the embodiments explicitly described, and alternative embodiments for dithering a quantization threshold are contemplated to be within the scope of the present disclosure.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer.

By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The instructions or code associated with a computer-readable medium of the computer program product may be executed by a computer, e.g., by one or more processors, such as one or more digital signal processors (DSPs), general purpose microprocessors, ASICs, FPGAs, or other equivalent integrated or discrete logic circuitry.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

A number of aspects and examples have been described. However, various modifications to these examples are possible, and the principles presented herein may be applied to other aspects as well. These and other aspects are within the scope of the following claims.

The invention claimed is:

1. A method for improving the performance of a phase-locked loop (PLL), the PLL generating an output signal DCLK based on a reference signal FCLK, the PLL comprising a time-to-digital converter (TDC) for quantizing a time interval elapsing between an event in FCLK and a corresponding event in DCLK using a quantization step size, the method comprising:
dithering a quantization threshold of the TDC, the dithering comprising introducing a pseudo-random delay less than or equal to the quantization step size, wherein the event in FCLK is a rising edge of FCLK, and the corresponding event in DCLK is a second preceding rising edge of DCLK.

2. The method of claim 1, the TDC comprising a delay line with a plurality of buffers, the dithering comprising adjusting the amount of delay applied by a first subset of said plurality of buffers, the delay applied by said first subset of buffers preceding the delay applied by the rest of said plurality of buffers.

3. The method of claim 1, the TDC subtracting from the estimated time interval a number of delays corresponding to one full cycle of DCLK.

4. The method of claim 3, the number of delays corresponding to one full cycle of DCLK being an average number of delays corresponding to one full cycle of DCLK.

5. The method of claim 3, further comprising determining a number of delays between transitions in a composite signal to determine the number of delays corresponding to one full cycle of DCLK, the composite signal comprising the outputs of a plurality of buffers.

6. The method of claim 1, wherein the dithering further comprises adjusting the total amount of delay.

7. The method of claim 6, wherein adjusting the total amount of delay comprises varying the delay associated with at least one buffer of a plurality of buffers.

8. The method of claim 7, wherein adjusting the total amount of delay further comprises varying a delay associated with a first buffer of the plurality of buffers, the delay applied by the first buffer preceding a delay applied by the rest of the plurality of buffers.

9. The method of claim 1, the dithering comprising changing a quantization threshold of the TDC every time a time interval is sampled by the TDC.

10. The method of claim 1, the PLL being an all-digital PLL (ADPLL).

11. A time-to-digital converter (TDC) for a digital phase-locked loop (PLL), the TDC quantizing a time interval elapsing between an event in a signal FCLK and a corresponding event in a signal DCLK using a quantization step size and outputting a digital TDC output signal,
wherein:
a quantization threshold of the TDC is dithered by an amount less than the quantization step size, and
the event in FCLK is a rising edge of FCLK, the corresponding event in DCLK is a second preceding rising edge of DCLK.

12. The TDC of claim 11, the TDC comprising a delay line with a plurality of buffers, the dithering comprising adjusting the amount of delay applied by a first subset of said plurality of buffers, the delay applied by said first subset of buffers preceding the delay applied by the rest of said plurality of buffers.

13. The TDC of claim 11, the TDC subtracting from the estimated time interval a number of delays corresponding to one full cycle of DCLK.

14. The TDC of claim 13, the number of delays corresponding to one full cycle of DCLK being an average number of delays corresponding to one full cycle of DCLK.

15. The TDC of claim 11, wherein the quantization threshold is further dithered by adjusting the total amount of delay.

16. The TDC of claim 15, wherein adjusting the total amount of delay comprises varying the delay associated with at least one buffer of a plurality of buffers.

17. The TDC of claim 16, wherein adjusting the total amount of delay further comprises varying a delay associated with a first buffer of the plurality of buffers, the delay applied by the first buffer preceding a delay applied by the rest of the plurality of buffers.

18. The TDC of claim 11, wherein the quantization thresholds are dithered by changing a quantization threshold of the TDC every time a time interval is sampled by the TDC.

19. The TDC of claim 11, the digital PLL being an all-digital PLL (ADPLL).

20. An apparatus for improving the performance of a phase-locked loop (PLL), the PLL generating an output signal DCLK based on a reference signal FCLK, the PLL comprising a time-to-digital converter (TDC) for quantizing a time interval elapsing between an event in FCLK and a corresponding event in DCLK using a quantization step size, the apparatus comprising:

means for dithering a quantization threshold of the TDC by introducing a pseudo-random delay less than or equal to the quantization step size, wherein the event in FCLK is a rising edge of FCLK, and the corresponding event in DCLK is a second preceding rising edge of DCLK.

21. The apparatus of claim 20, wherein the TDC comprises a delay line with a plurality of buffers, the means for dithering comprises means for adjusting the amount of delay applied by a first subset of said plurality of buffers such that the delay applied by the first subset of buffers precedes the delay applied by the rest of the plurality of buffers.

22. The apparatus of claim 20, further comprising means for subtracting from the estimated time interval a number of delays corresponding to one full cycle of DCLK.

23. The method of claim 22, wherein the number of delays corresponding to one full cycle of DCLK is an average number of delays corresponding to one full cycle of DCLK.

24. The method of claim 22, further comprising means for determining a number of delays between transitions in a composite signal to determine the number of delays corresponding to one full cycle of DCLK, the composite signal comprising outputs of a plurality of buffers.

25. A non-transitory processor-readable storage medium having stored thereon processor-executable instructions configured to cause an electronic device processor to perform operations comprising:

generating an output signal (DCLK) based on a reference signal (FCLK);

quantizing a time interval elapsing between an event in the FCLK and a corresponding event in the DCLK using a quantization step size;

dithering a quantization threshold of a time-to-digital converter (TDC), the dithering comprising introducing a pseudo-random delay less than or equal to the quantization step size, wherein the event in FCLK is a rising edge of FCLK, and the corresponding event in DCLK is a second preceding rising edge of DCLK.

26. The non-transitory processor-readable storage medium of claim 25, wherein the stored processor-executable instructions are configured to cause an electronic device processor to perform operations further comprising:

adjusting an amount of delay applied by a first subset of a plurality of buffers such that the delay applied by the first subset of buffers precedes the delay applied by the rest of the plurality of buffers.

27. The non-transitory processor-readable storage medium of claim 25, wherein the stored processor-executable instructions are configured to cause an electronic device processor to perform operations further comprising subtracting from the estimated time interval a number of delays corresponding to one full cycle of DCLK.

28. The non-transitory processor-readable storage medium of claim 27, wherein the stored processor-executable instructions are configured to cause an electronic device processor to perform operations further comprising calculating the number of delays corresponding to one full cycle of DCLK as an average number of delays corresponding to one full cycle of DCLK.

29. The non-transitory processor-readable storage medium of claim 27, wherein the stored processor-executable instructions are configured to cause an electronic device processor to perform operations further comprising determining a number of delays between transitions in a composite signal to determine the number of delays corresponding to one full cycle of DCLK, wherein the composite signal comprises outputs of a plurality of buffers.

\* \* \* \* \*